US012763751B2

(12) United States Patent
Ouchi

(10) Patent No.: US 12,763,751 B2
(45) Date of Patent: Oct. 13, 2026

(54) ACOUSTIC WAVE DEVICE

(71) Applicant: Murata Manufacturing Co., Ltd., Nagaokakyo (JP)

(72) Inventor: Minefumi Ouchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 643 days.

(21) Appl. No.: 17/955,997

(22) Filed: Sep. 29, 2022

(65) Prior Publication Data

US 2023/0024731 A1 Jan. 26, 2023

Related U.S. Application Data

(63) Continuation of application No. PCT/JP2021/013328, filed on Mar. 29, 2021.

(30) Foreign Application Priority Data

Mar. 30, 2020 (JP) ................................ 2020-060408

(51) Int. Cl.
*H03H 9/02* (2006.01)

(52) U.S. Cl.
CPC .... *H03H 9/02157* (2013.01); *H03H 9/02417* (2013.01)

(58) Field of Classification Search
CPC ... H03H 9/02; H03H 9/02157; H03H 9/02228
(Continued)

(56) References Cited

U.S. PATENT DOCUMENTS 8,344,815 B2 1/2013 Yamanaka
10,491,192 B1 * 11/2019 Plesski .............. H03H 9/02228
(Continued)

FOREIGN PATENT DOCUMENTS

CN 109417372 A 3/2019
CN 109698681 A 4/2019
(Continued)

OTHER PUBLICATIONS

S. Yandrapalli, V. Plessky, J. Koskela, V. Yantchev, P. Turner and L. G. Villanueva, Analysis of XBAR Resonance and Higher Order Spurious Modes, 2019 IEEE Intâl. Ultrasonics Symp. (IUS), Oct. 6-9, 2019, pp. 185-188. (Year: 2019).*
(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a piezoelectric film made of lithium niobate or lithium tantalate, first and second busbar electrodes located on the piezoelectric film and opposite to each other, and first and second electrode fingers and each including one end coupled to the first busbar electrode or the second busbar electrode. The acoustic wave device uses bulk waves in a first thickness-shear mode. A first gap is provided between the first busbar electrode and the second electrode finger. A second gap is provided between the second busbar electrode and the first electrode finger. A length of the first gap and the second gap in a direction in which the first and second electrode fingers extend is about 0.92p or longer, where p is a center-to-center distance between the adjacent first and second electrode fingers.

20 Claims, 8 Drawing Sheets

(58) Field of Classification Search
USPC .......................................................... 333/187
See application file for complete search history.

(56) References Cited

U.S. PATENT DOCUMENTS

| | | | | |
|---|---|---|---|---|
| 10,637,438 | B2 | 4/2020 | Garcia et al. | |
| 10,826,462 | B2 | 11/2020 | Plesski et al. | |
| 11,146,231 | B2 | 10/2021 | Plesski | |
| 2004/0090145 | A1 | 5/2004 | Bauer et al. | |
| 2009/0231061 | A1* | 9/2009 | Tanaka | H03H 9/02551 333/195 |
| 2010/0102669 | A1 | 4/2010 | Yamanaka | |
| 2010/0223999 | A1 | 9/2010 | Onoe | |
| 2011/0199163 | A1 | 8/2011 | Yamanaka | |
| 2012/0161577 | A1* | 6/2012 | Abbott | H03H 9/02724 310/313 C |
| 2013/0057360 | A1 | 3/2013 | Meltaus et al. | |
| 2014/0145556 | A1 | 5/2014 | Kadota | |
| 2014/0145557 | A1* | 5/2014 | Tanaka | H03H 9/059 310/313 D |
| 2016/0182010 | A1* | 6/2016 | Nakamura | H03H 9/1457 310/313 A |
| 2017/0104470 | A1 | 4/2017 | Koelle et al. | |
| 2018/0123016 | A1 | 5/2018 | Gong et al. | |
| 2018/0152169 | A1 | 5/2018 | Goto et al. | |
| 2018/0159494 | A1 | 6/2018 | Goto et al. | |
| 2019/0097607 | A1 | 3/2019 | Mimura | |
| 2019/0123713 | A1 | 4/2019 | Daimon | |
| 2020/0021271 | A1 | 1/2020 | Plesski | |
| 2020/0295730 | A1 | 9/2020 | Nagatomo et al. | |
| 2020/0373907 | A1 | 11/2020 | Garcia | |
| 2021/0006228 | A1 | 1/2021 | Garcia | |
| 2021/0013868 | A1 | 1/2021 | Plesski et al. | |
| 2021/0104998 | A1 | 4/2021 | Plesski | |
| 2021/0273632 | A1 | 9/2021 | Yantchev et al. | |
| 2022/0014172 | A1* | 1/2022 | Nozoe | H03H 9/02574 |
| 2022/0231661 | A1 | 7/2022 | Mchugh et al. | |

FOREIGN PATENT DOCUMENTS

| | | | |
|---|---|---|---|
| JP | 2010103803 | A | 5/2010 |
| JP | 2010233210 | A | 10/2010 |
| JP | 2012257019 | A | 12/2012 |
| JP | 2013115496 | A | 6/2013 |
| JP | 2013528996 | A | 7/2013 |
| JP | 2018074575 | A | 5/2018 |
| WO | 2010047114 | A1 | 4/2010 |
| WO | 2012137027 | A1 | 10/2012 |
| WO | 2013021948 | A1 | 2/2013 |
| WO | 2018003282 | A1 | 1/2018 |
| WO | 2019111664 | A1 | 6/2019 |

OTHER PUBLICATIONS

Resonant Inc.—A Murata Company, RF Filter Solutions for Next Generation Wireless Networks, retrieved May 13, 2025, www.resonant.com (Year: 2025).*

International Search Report in PCT/JP2021/013328, mailed May 18, 2021, 5 pages.

Written Opinion in PCT/JP2021/013328, mailed May 18, 2021, 6 pages.

Official Communication issued in corresponding Chinese Patent Application No. 202180025103.1, mailed on May 9, 2025, 8 pages.

International Search Report and Written Opinion for PCT Application No. PCT/US2023/017732, mailed Jul. 27, 2023, 12 pages.

International Search Report and Written Opinion for PCT Application No. PCT/US2022/081095, mailed May 30, 2023, 12 pages.

* cited by examiner

ACOUSTIC WAVE DEVICE

CROSS REFERENCE TO RELATED APPLICATIONS

This application claims the benefit of priority to Japanese Patent Application No. 2020-060408 filed on Mar. 30, 2020 and is a Continuation Application of PCT Application No. PCT/JP2021/013328 filed on Mar. 29, 2021. The entire contents of each application are hereby incorporated herein by reference.

BACKGROUND OF THE INVENTION

1. Field of the Invention

The present invention relates to an acoustic wave device.

2. Description of the Related Art

There are some known acoustic wave devices that use plate waves propagating in a piezoelectric film made of $LiNbO_3$ or $LiTaO_3$. For example, Japanese Unexamined Patent Application Publication No. 2012-257019 discloses an acoustic wave device using Lamb waves as plate waves. In this example, a piezoelectric substrate is made of $LiNbO_3$ or $LiTaO_3$. An interdigital transducer (IDT) electrode is provided on the upper surface of the piezoelectric substrate. A plurality of electrode fingers of the IDT electrode are coupled to an electric potential, and another plurality of electrode fingers of the IDT electrode are coupled to another electric potential. Voltage is applied between the plurality of electrode fingers and the other plurality of electrode fingers, and as a result, Lamb waves are excited. Reflectors are provided on both sides with respect to the IDT electrode.

As such, an acoustic wave resonator using plate waves is formed.

SUMMARY OF THE INVENTION

To miniaturize an acoustic wave device, one idea is to reduce the number of electrode fingers. However, if the number of electrode fingers is reduced, the Q factor decreases. If the distance between electrode fingers and busbars of the IDT electrode is made too short, a problem arises in that the electrode fingers and busbars interfere with each other to cause spurious waves, so that the resonance characteristic deteriorates.

Preferred embodiments of the present invention provide acoustic wave devices that each can be miniaturized with increased Q factor and less deterioration of resonance characteristics.

An acoustic wave device according to a preferred embodiment of the present invention includes a piezoelectric film made of lithium niobate or lithium tantalate, a first busbar electrode and a second busbar electrode located on the piezoelectric film and opposite to each other, and a first electrode finger and a second electrode finger on the piezoelectric film, the first electrode finger including one end coupled to the first busbar electrode, the second electrode finger including one end coupled to the second busbar electrode. The acoustic wave device is configured to use bulk waves in a first thickness-shear mode. The first electrode finger and the second electrode finger extend in a first direction, the first direction is perpendicular to a second direction, the first electrode finger and the second electrode finger face each other in the second direction. A first gap is provided between the first busbar electrode and the second electrode finger, and a second gap is provided between the second busbar electrode and the first electrode finger. A length of the first gap in the first direction and a length of the second gap in the first direction are both about 0.92p or longer, where p is a center-to-center distance between the first electrode finger and the second electrode finger, and the first electrode finger and the second electrode finger are adjacent to each other.

An acoustic wave device according to another preferred embodiment of the present invention includes a piezoelectric film made of lithium niobate or lithium tantalate, a first busbar electrode and a second busbar electrode located on the piezoelectric film and opposite to each other, and a first electrode finger and a second electrode finger on the piezoelectric film, the first electrode finger including one end coupled to the first busbar electrode, the second electrode finger including one end coupled to the second busbar electrode. Further, d/p is about 0.5 or smaller, where d is a thickness of the piezoelectric film, p is a center-to-center distance between the first electrode finger and the second electrode finger, and the first electrode finger and the second electrode finger are adjacent to each other. The first electrode finger and the second electrode finger extend in a first direction, the first direction is perpendicular to a second direction, and the first electrode finger and the second electrode finger face each other in the second direction. A first gap is provided between the first busbar electrode and the second electrode finger, and a second gap is provided between the second busbar electrode and the first electrode finger. A length of the first gap in the first direction and a length of the second gap in the first direction are both about 0.92p or longer.

The acoustic wave devices according to preferred embodiments of the present invention can be miniaturized with increased Q factor and less deterioration of the resonance characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be elucidated by describing specific preferred embodiments of the present invention with reference to the drawings.

It should be noted that the preferred embodiments described in this specification are merely examples, and configurations of different preferred embodiments may be partially replaced or combined.

Figure 1A:
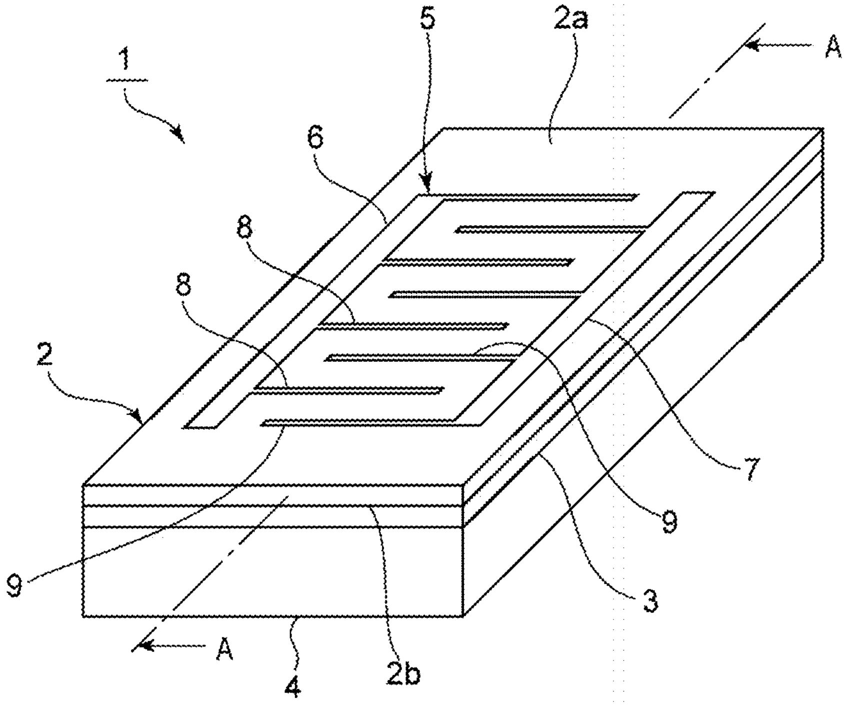
FIG. 1A is a schematic perspective view of the exterior of an acoustic wave device according to a first preferred embodiment of the present invention.
Figure 1B:
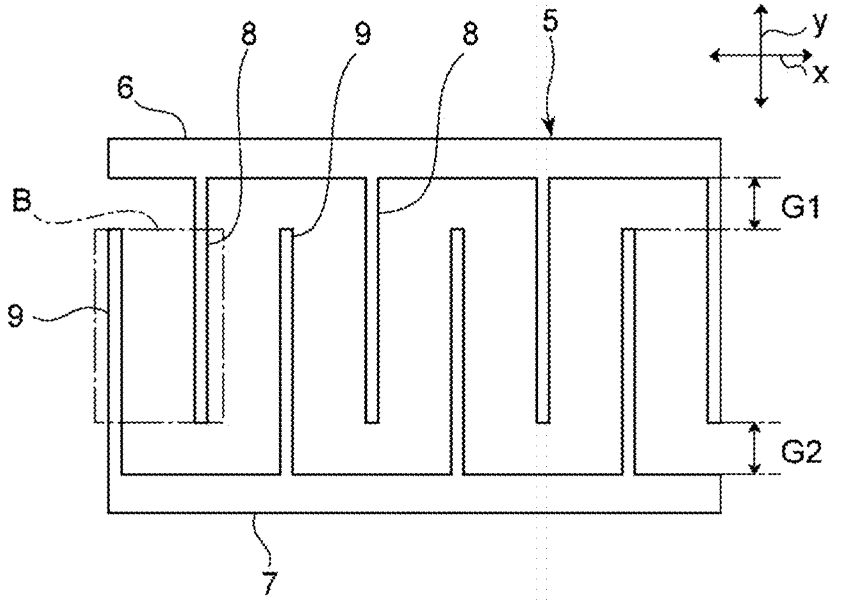
FIG. 1B is a plan view of a structure of an electrode on a piezoelectric film, according to the first preferred embodiment of the present invention.

FIG. 1A is a schematic perspective view of the exterior of an acoustic wave device according to a first preferred embodiment of the present invention. FIG. 1B is a plan view of a structure of an electrode on a piezoelectric film, according to the first preferred embodiment.

As illustrated in FIG. 1A, an acoustic wave device 1 includes a piezoelectric film 2. The piezoelectric film 2 has a first major surface 2*a* and a second major surface 2*b*. The first major surface 2*a* and the second major surface 2*b* are opposite to each other. In the present preferred embodiment, the piezoelectric film 2 is a lithium niobate film. More specifically, the piezoelectric film 2 is a $LiNbO_3$ film. The material of the piezoelectric film 2 is not limited to the above example. For example, lithium tantalate ($LiTaO_3$) may be used as the material of the piezoelectric film 2. It is preferable that the thickness of the piezoelectric film 2 be in the range of about 40 nm to about 1000 nm, for example.

A functional electrode 5 is disposed on the first major surface 2*a* of the piezoelectric film 2. As illustrated in FIG. 1B, the functional electrode 5 includes a plurality of electrode fingers. The plurality of electrode fingers are arranged in a direction crossing the thickness direction of the piezoelectric film 2. The plurality of electrode fingers include first electrode fingers 8 and second electrode fingers 9 in a plurality of pairs. The functional electrode 5 further includes a first busbar electrode 6 and a second busbar electrode 7. The first busbar electrode 6 and the second busbar electrode 7 are opposite to each other. One end of each first electrode finger 8 is coupled to the first busbar electrode 6. The other ends of the first electrode fingers 8 face the second busbar electrode 7. One end of each second electrode finger 9 is coupled to the second busbar electrode 7. The other ends of the second electrode fingers 9 face the first busbar electrode 6. The first electrode fingers 8 and the second electrode fingers 9 are elongated in parallel with each other. The first electrode fingers 8 and the second electrode fingers 9 interdigitate with each other.

Here, the direction in which the first electrode fingers 8 and the second electrode fingers 9 are elongated is referred to as a first direction y, and a direction perpendicular to the first direction y is referred to as a second direction x. In the second direction x, the first electrode fingers 8 and the second electrode fingers 9 face each other. Both the first direction y and the second direction x cross the thickness direction of the piezoelectric film 2. It can also be said that the first electrode fingers 8 and the second electrode fingers 9 face each other in a direction crossing the thickness direction of the piezoelectric film 2.

The first electrode fingers 8 and the second electrode fingers 9 are coupled to different electric potentials. When viewed in the second direction x, a region in which the adjacent first electrode finger 8 and second electrode finger 9 in a pair overlap is an excitation domain B. FIG. 1B illustrates one excitation domain B as an example, but individual regions between the first electrode fingers 8 and the second electrode fingers 9 are excitation domains B.

Here, a center-to-center distance between adjacent first electrode finger 8 and second electrode finger 9 is indicated by p. The center-to-center distance between the first electrode finger 8 and the second electrode finger 9 is a distance obtained by connecting the center of the first electrode finger 8 in the second direction x to the center of the second electrode finger 9 in the second direction x.

As illustrated in FIG. 1B, a first gap G1 is provided between the first busbar electrode 6 and the second electrode fingers 9, and a second gap G2 is provided between the second busbar electrode 7 and the first electrode fingers 8. In the present preferred embodiment, the length of the first gap G1 in the first direction y and the length of the second gap G2 in the first direction y are both about 0.92p or longer, for example. The length of the first gap G1 in the first direction y is the same as the length of the second gap G2 in the first direction y. The length of the first gap G1 in the first direction y may be different from the length of the second gap G2 in the first direction y. It is only necessary that the length of at least one of the first gap G1 and the second gap G2 in the first direction y is about 0.92p or longer.

The functional electrode 5 is made of a suitable metal or alloy such as Al or an AlCu alloy. It is preferable that Cu in the AlCu alloy be in the range of about 1 to about 10 percent by weight. The functional electrode 5 may be made of a multilayer metal film. In this case, the multilayer metal film may include, for example, an adhesion layer. Examples of the adhesion layer include a Ti layer and a Cr layer.

Figure 2:
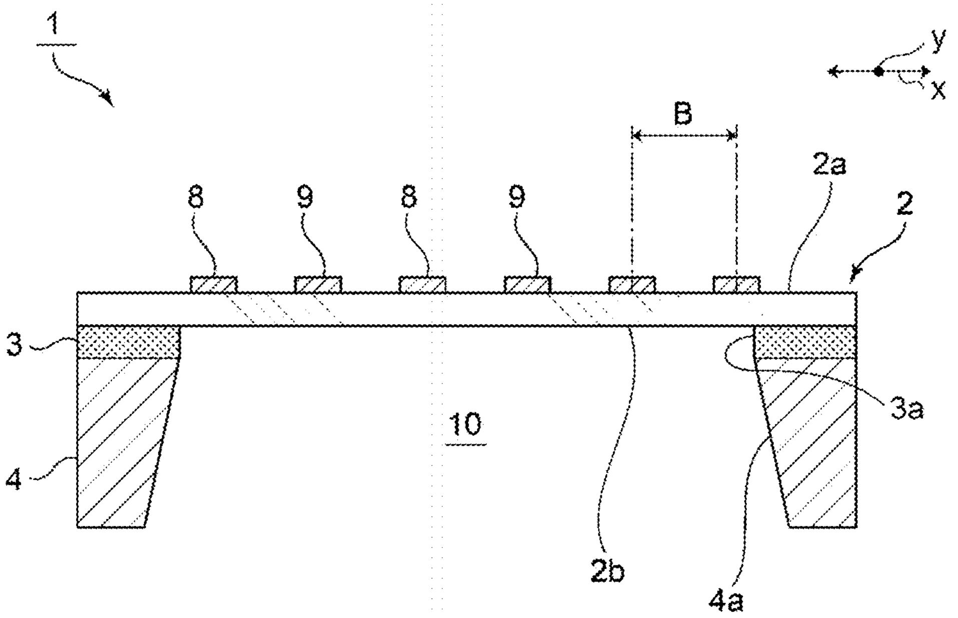
FIG. 2 is a sectional view taken along line A-A in FIG. 1A.

FIG. 2 is a sectional view taken along line A-A in FIG. 1A.

A supporting member 4 is stacked on the second major surface 2*b* of the piezoelectric film 2 with an insulating layer 3 interposed therebetween. The insulating layer 3 and the supporting member 4 are shaped as frames. The insulating layer 3 has an opening 3*a*. The supporting member 4 has an opening 4*a*. The openings 3*a* and 4*a* together form an air gap 10. The air gap 10 is provided for the purpose of not obstructing oscillation in the excitation domain B of the piezoelectric film 2. The supporting member 4 does not overlap at least one first electrode finger 8 and second electrode finger 9 pair when viewed in plan view. The insulating layer 3 is not necessarily provided. Thus, the supporting member 4 may be stacked directly or indirectly on the second major surface 2*b* of the piezoelectric film 2.

The insulating layer 3 is made of silicon oxide. As well as silicon oxide, other suitable insulating material such as silicon oxynitride or alumina may be used. The supporting member is made of Si. The surface orientation of Si forming the supporting member 4 may be, with respect to the surface on the piezoelectric film 2 side, (100), (111), or (110). It is desirable that Si used for the supporting member 4 exhibit a high resistivity of 4 kΩ or higher. The supporting member 4 may also be made with an insulating material or semiconductor material.

In the present preferred embodiment, no reflector is provided at the piezoelectric film 2. The acoustic wave device 1 does not have a reflector. Alternatively, when the acoustic wave device 1 has a reflector, the reflector can be provided with a reduced number of electrode fingers. This is because the acoustic wave device 1 uses bulk waves in a first thickness-shear mode.

The acoustic wave device 1 preferably uses bulk waves in the first thickness-shear mode, and the length of the first gap G1 and the second gap G2 in the first direction y is about 0.92p or longer. As a result, the acoustic wave device can be miniaturized with increased Q factor and less deterioration of the resonance characteristic. The following describes this effect in detail together with details of the first thickness-shear mode.

As illustrated in FIG. 2, a plurality of adjacent first electrode finger 8 and second electrode finger 9 pairs are arranged in the second direction x. The number of pairs of electrode fingers is not necessarily an integer and may be 1.5 or 2.5, for example. The expression “adjacent electrode fingers” in the functional electrode 5 denotes electrode fingers spaced apart from each other, not electrode fingers in direct contact with each other. Additionally, when the first electrode finger 8 and the second electrode finger 9 are adjacent to each other, no hot electrode or ground electrode is disposed between the first electrode finger 8 and the second electrode finger 9.

To drive the acoustic wave device 1, alternating-current voltage is applied between the first electrode fingers 8 and the second electrode fingers 9. More specifically, alternating-current voltage is applied between the first busbar electrode 6 and the second busbar electrode 7. As a result, bulk waves in the first thickness-shear mode are excited in the piezoelectric film 2.

In the acoustic wave device 1, d/p is about 0.5 or smaller, for example, where d is the thickness of the piezoelectric film 2, and p is the center-to-center distance between adjacent first electrode finger 8 and second electrode finger 9. Thus, bulk waves in the first thickness-shear mode described above are effectively excited, and as a result, a favorable resonance characteristic can be achieved.

The acoustic wave device 1 has the structure described above and uses bulk waves in the first thickness-shear mode. Thus, when first electrode finger 8 and second electrode finger 9 pairs are reduced in number for the purpose of miniaturization, the Q factor is unlikely to drop.

In the present preferred embodiment, the piezoelectric film 2 is made of a Z-cut piezoelectric material. The second direction x is a direction perpendicular to the polarization direction of the piezoelectric film 2. The same does not hold for cases using piezoelectric materials of other cut-angles as the piezoelectric film 2.

Figure 3A:
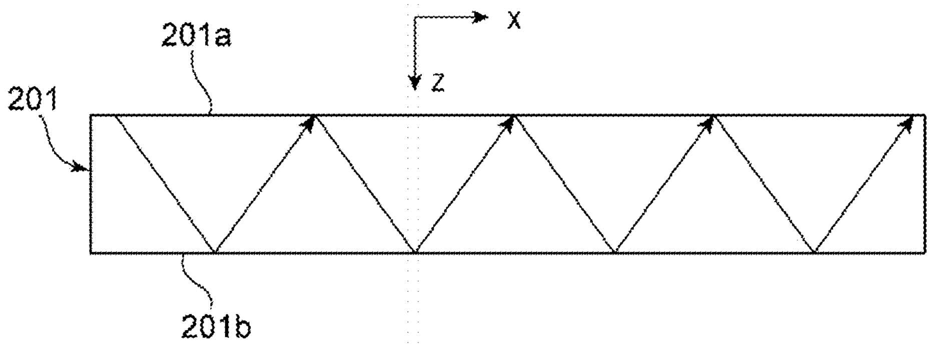
FIG. 3A is a schematic elevational cross-sectional view illustrating Lamb waves propagating in a piezoelectric film of a known acoustic wave device.
Figure 3B:
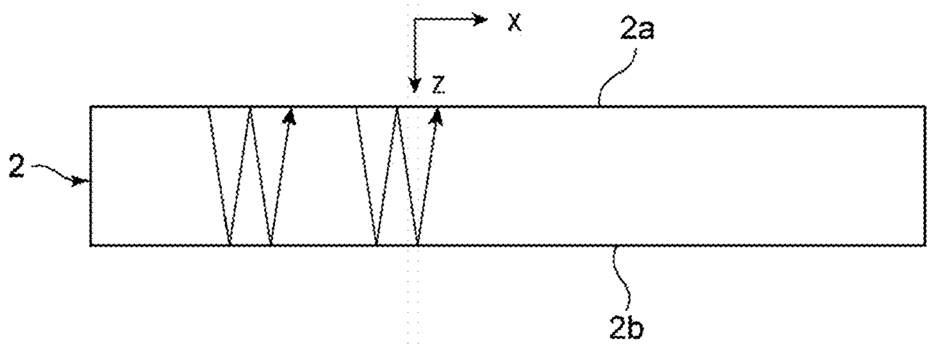
FIG. 3B is a schematic elevational cross-sectional view illustrating bulk waves in a first thickness-shear mode propagating in a piezoelectric film in an acoustic wave device according to a preferred embodiment of the present invention.

The following describes the difference between bulk wave in the first thickness-shear mode and Lamb wave, which is used in known technologies, with reference to FIGS. 3A and 3B.

FIG. 3A is a schematic elevational cross-sectional view illustrating Lamb waves propagating in a piezoelectric film of an acoustic wave device as described in Japanese Unexamined Patent Application Publication No. 2012-257019. In this case, waves propagate in a piezoelectric film 201 as indicated by arrows. The piezoelectric film 201 has a first major surface 201*a* and a second major surface 201*b* that are opposite to each other. The thickness direction of the piezoelectric film 201, along a line connecting the first major surface 201*a* and the second major surface 201*b*, is referred to as a third direction z. Electrode fingers of an interdigital transducer (IDT) electrode are arranged in the second direction x. As illustrated in FIG. 3A, Lamb waves propagate in the second direction x. Because Lamb wave is a plate wave, as well as vibrating the entire piezoelectric film 201, the waves propagate in the second direction x. For this reason, reflectors are disposed on both sides with respect to the IDT electrode in the second direction x, thereby acquiring the resonance characteristic.

By contrast, as illustrated in FIG. 3B, in an acoustic wave device according to a preferred embodiment of the present invention, oscillation changes in the thickness-shear direction. For this reason, waves mostly propagate in the third direction z and cause resonance. As a result, the component of wave in the second direction x is significantly smaller than the component of wave in the third direction z. Because the resonance characteristic is based on wave propagation in the third direction z, when electrode fingers of reflectors are reduced in number, the propagation loss is unlikely to occur. Additionally, when the number of first electrode finger 8 and second electrode finger 9 pairs is reduced for the purpose of miniaturization, the Q factor is unlikely to drop.

Figure 4:
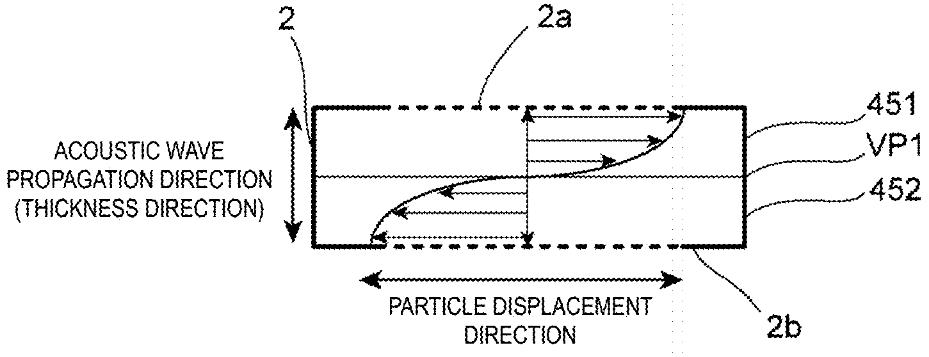
FIG. 4 illustrates directions of amplitude of bulk waves in the first thickness-shear mode.

The direction of amplitude of bulk waves in the first thickness-shear mode is, as illustrated in FIG. 4, opposite between a first region 451 and a second region 452 of the excitation domain of the piezoelectric film 2. FIG. 4 schematically illustrates a bulk wave excited when a voltage is applied between the first electrode fingers 8 and the second electrode fingers 9 so that the electric potential at the second electrode fingers 9 is higher than the electric potential at the first electrode fingers 8. In the excitation domain, the first region 451 is a region between an imaginary plane VP1, which is indicated perpendicular to the thickness direction of the piezoelectric film 2 to divide the piezoelectric film 2 into two, and the first major surface 2*a*. The second region 452 is a region between the imaginary plane VP1 and the second major surface 2*b* in the excitation domain.

As described above, in the acoustic wave device 1, a plurality of first electrode finger 8 and second electrode finger 9 pairs are arranged. Because waves do not propagate in the second direction x in the first thickness-shear mode, it is unnecessary to provide a plurality of first electrode finger 8 and second electrode finger 9 pairs. Hence, it is only necessary to provide at least one first electrode finger 8 and second electrode finger 9 pair.

In the acoustic wave device 1, the first electrode fingers 8 are coupled to a hot potential, and the second electrode fingers 9 are coupled to a ground potential. The first electrode fingers 8 may be coupled to a ground potential, and the second electrode fingers 9 may be coupled to a hot potential. In the present preferred embodiment, at least one pair of electrode fingers are coupled to a hot potential or ground potential as described above, and no floating electrode is provided.

In the present preferred embodiment, d/p is about 0.5 or smaller, for example. It is preferable that d/p be about 0.24 or smaller, for example. In this case, a more favorable resonance characteristic can be achieved. This will be described with reference to FIG. 5.

Figure 5:
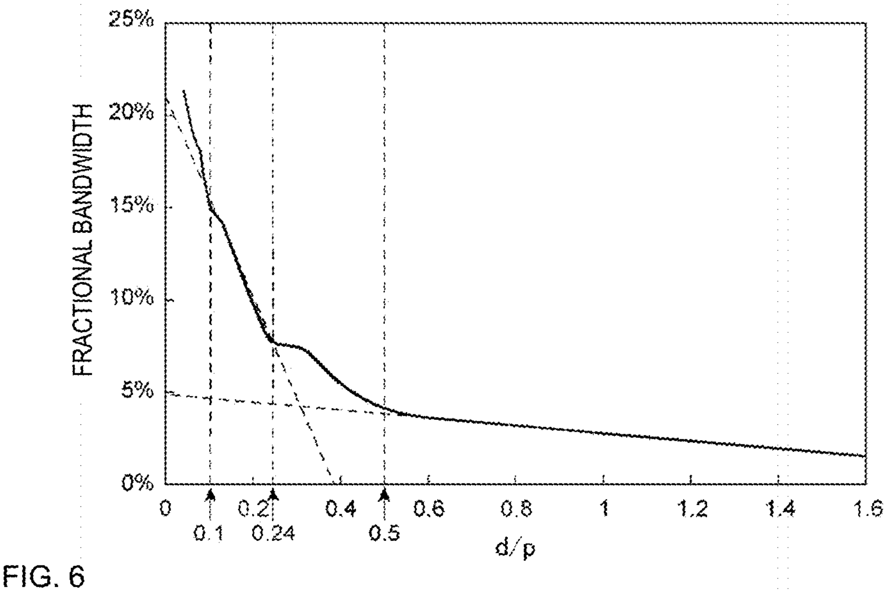
FIG. 5 illustrates a plot of fractional bandwidth of resonator versus d/p, where p is a center-to-center distance or average center-to-center distance between adjacent first and second electrode fingers, and d is the thickness of piezoelectric film.

A plurality of acoustic wave devices were prepared by changing d/p. FIG. 5 illustrates a plot of fractional bandwidth of acoustic wave device as resonator versus d/p.

As seen in FIG. 5, when d/p>0.5, while d/p is controlled, the fractional bandwidth is maintained at about 5% or smaller. By contrast, when d/p≤0.5, while d/p is changed within the range, the fractional bandwidth reaches about 5% or greater. As such, a resonator of a large coupling coefficient can be configured. When d/p is about 0.24 or smaller, the fractional bandwidth is as large as about 7% or greater, for example. When d/p is controlled within this range, a resonator of a greater fractional bandwidth can be configured, so that a resonator of a larger coupling coefficient can be made. For example, when the piezoelectric film 2 is uneven with thickness variations, the average of thickness may be used.

It is preferable that the center-to-center distance p between the adjacent first electrode finger 8 and second electrode finger 9 be within the range of about 1 μm to about 10 μm, for example. When the measurement of a line along the plurality of electrode fingers of the functional electrode 5 in the second direction x is designated as width, it is preferable that the width of the first electrode fingers 8 and the width of the second electrode fingers 9 be each within the range of about 50 nm to about 1000 nm, for example.

As illustrated in FIG. 1B, in the first preferred embodiment, the length of the first gap G1 and the second gap G2 in the first direction y is about 0.92p or longer, for example. As a result, the acoustic wave device can be miniaturized with less deterioration of the resonance characteristic. This will be described in detail below.

A plurality of acoustic wave devices were prepared by changing the length of the first gap and the second gap in the first direction. The impedance characteristic was measured on the plurality of acoustic wave device. Each acoustic wave device includes one first electrode finger and second electrode finger pair. The design parameters of the prepared acoustic wave devices are as indicated in the following:

Piezoelectric film: material $LiNbO_3$, thickness about 400 nm

Number of first electrode finger and second electrode finger pairs=one pair

Figure 6:
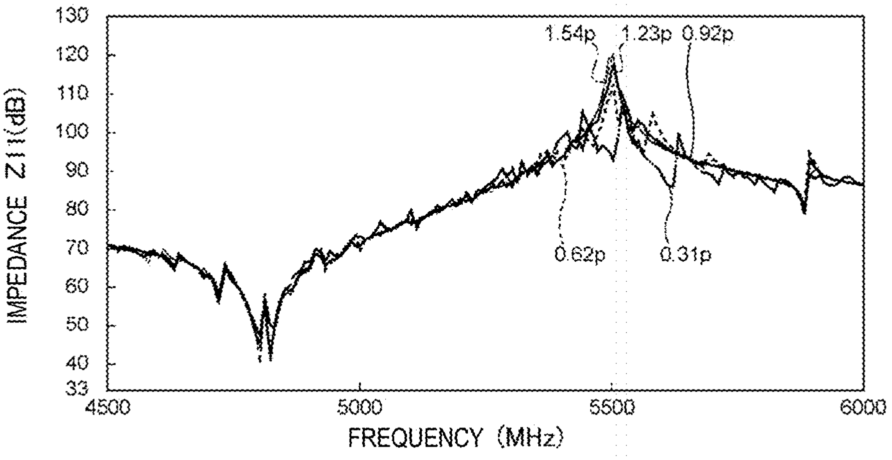
FIG. 6 illustrates impedance-frequency characteristics when the length of a first gap and a second gap in a first direction is in the range of about 0.31p to about 1.54p.
Figure 7:
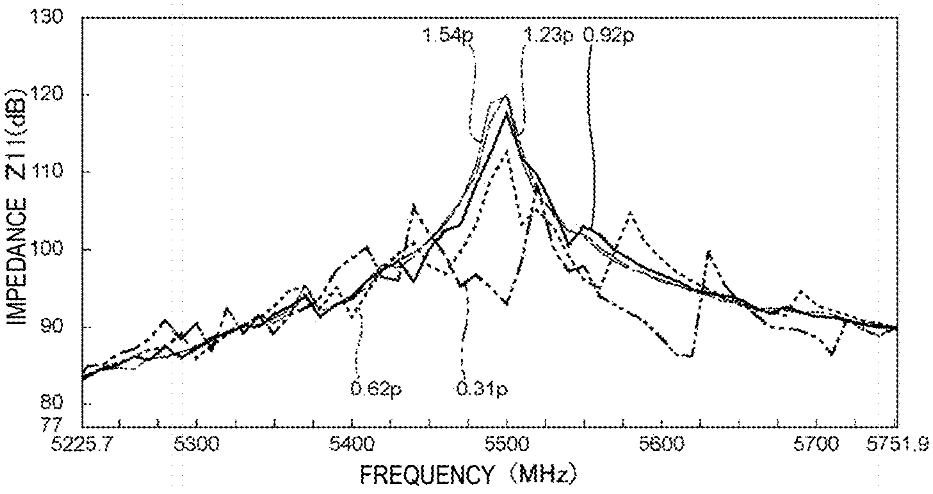
FIG. 7 is an enlarged view of FIG. 6.
Figure 8:
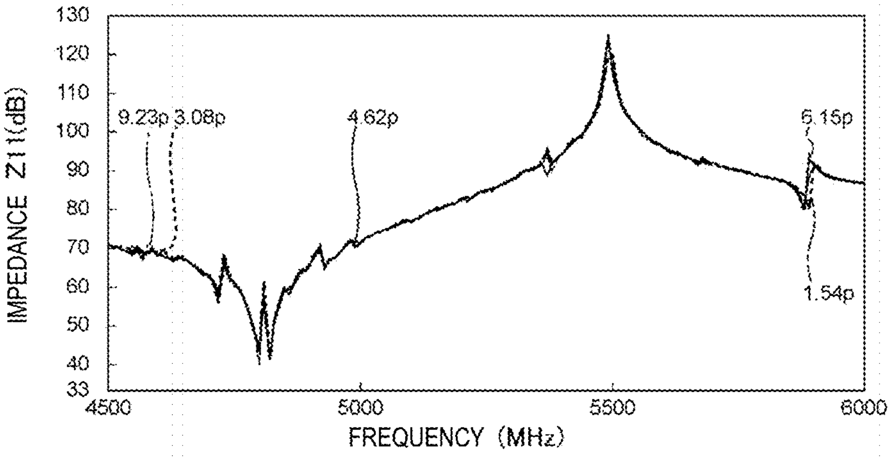
FIG. 8 illustrates impedance-frequency characteristics when the length of a first gap and a second gap in a first direction is in the range of about 1.54p to about 9.23p.

Length of the first gap and the second gap in the first direction: about 0.31p, about 0.62p, about 0.92p, about 1.23p, about 1.54p, about 3.08p, about 4.62p, about 6.15p, about 9.23p FIG. 6 illustrates impedance-frequency characteristics when the length of the first gap and the second gap in the first direction is in the range of about 0.31p to about 1.54p, for example. FIG. 7 is an enlarged view of FIG. 6. FIG. 8 illustrates impedance-frequency characteristics when the length of the first gap and the second gap in the first direction is in the range of about 1.54p to about 9.23p, for example.

As illustrated in FIGS. 6 and 7, a comparison with the case in which the length of the first gap and the second gap in the first direction is about 0.92p or longer indicates that the impedance characteristic is degraded in the case of about 0.62p, for example. In the case of about 0.31p, the impedance characteristic is further degraded. As described above, when the length is about 0.92p or shorter, the resonance characteristic deteriorates. By contrast, when the length of the first gap and the second gap in the first direction is about 0.92p or longer, the impedance characteristic does not change much. Further as illustrated in FIG. 8, when the length of the first gap and the second gap in the first direction is about 1.54p or longer, the impedance characteristic does not indicate any significant change.

To miniaturize the acoustic wave device, as well as reducing the number of electrode fingers, it is possible to shorten the length of the first gap and the second gap in the first direction. As illustrated in FIGS. 6 to 8, when the length of the first gap and the second gap in the second direction is made is made as short as about 0.92p, the resonance characteristic does not deteriorate much. In the first preferred embodiment, the length of the first gap G1 in the first direction y and the length of the second gap G2 in the first direction y are both about 0.92p or longer, for example. Additionally, in the first preferred embodiment, bulk waves in the first thickness-shear mode are preferably used. With these configurations, the acoustic wave device 1 can be miniaturized with increased Q factor and less deterioration of the resonance characteristic.

It is preferable that the length of the first gap G1 and the second gap G2 in the first direction y be about 9.2p or shorter, more preferably, about 3p or shorter, for example. With this configuration, the acoustic wave device 1 can be miniaturized in a preferred manner.

In the first preferred embodiment, the end of the second electrode finger 9 faces the first busbar electrode 6 across the first gap G1. The end of the first electrode finger 8 faces the second busbar electrode 7 across the second gap G2. This is, however, not to be interpreted as limiting. It is only necessary to interpose the first gap G1 between the first busbar electrode 6 and the second electrode finger 9. Also, it is only necessary to interpose the second gap G2 between the second busbar electrode and the first electrode finger 8. The following describes another example of such a configuration other than the first preferred embodiment.

Figure 9:
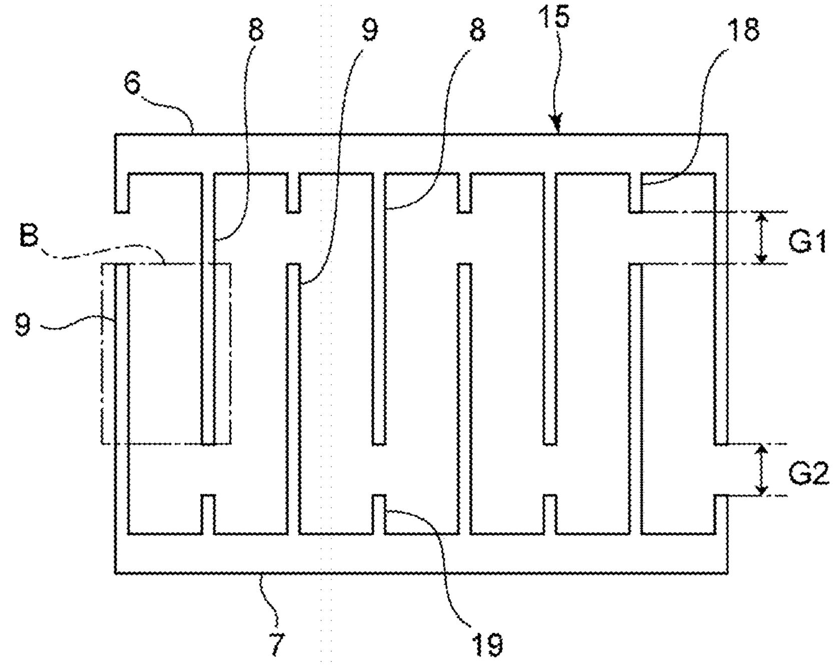
FIG. 9 is a plan view of an electrode structure of an acoustic wave device according to a second preferred embodiment of the present invention.

FIG. 9 is a plan view of an electrode structure of an acoustic wave device according to a second preferred embodiment of the present invention.

The present preferred embodiment differs from the first preferred embodiment in that a functional electrode 15 includes a plurality of first dummy electrode fingers 18 and a plurality of second dummy electrode fingers 19. Except for the above point, the acoustic wave device of the present preferred embodiment is configured in the same manner as the acoustic wave device 1 of the first preferred embodiment.

One end of each first dummy electrode finger 18 is coupled to the first busbar electrode 6. The first dummy electrode fingers 18 and the second electrode fingers 9 face each other. Also in the present preferred embodiment, the first gap G1 is interposed between the first busbar electrode 6 and the second electrode finger 9. More specifically, an end of the first dummy electrode finger 18 faces an end of the second electrode finger 9 across the first gap G1.

One end of each second dummy electrode finger 19 is coupled to the second busbar electrode 7. The second dummy electrode fingers 19 and the first electrode fingers 8 face each other. Also in the present preferred embodiment, the second gap G2 is interposed between the second busbar electrode 7 and the first electrode finger 8. More specifically, an end of the second dummy electrode finger 19 faces an end of the first electrode finger 8 across the second gap G2.

In the present preferred embodiment as well, the acoustic wave device uses bulk waves in the first thickness-shear mode, and the length of the first gap G1 and the second gap G2 in the first direction y is about 0.92p or longer, for example. With these configurations, the acoustic wave device can be miniaturized with increased Q factor and less deterioration of the resonance characteristic.

It has been confirmed that characteristics in the main mode do not indicate any significant changes when the width of the first dummy electrode finger 18 and the width of the second dummy electrode finger 19 are changed within the range of about 0.15 μm to about 0.3 μm, for example. It has been confirmed that characteristics in the main mode do not indicate any significant changes when the length of the first dummy electrode finger 18 in the first direction y and the length of the second dummy electrode finger 19 in the first direction y are changed within the range of about 1 μm to about 5 μm, for example.

A plurality of acoustic wave devices were prepared by changing the length of the first gap G1 and the second gap G2 in the first direction y. The impedance characteristic was measured on the plurality of acoustic wave device. Each acoustic wave device includes one first electrode finger and second electrode finger pair. The design parameters of the acoustic wave devices are as indicated in the following:

Piezoelectric film: material $LiNbO_3$, thickness about 400 nm

Number of first electrode finger and second electrode finger pairs=one pair

Figure 10:
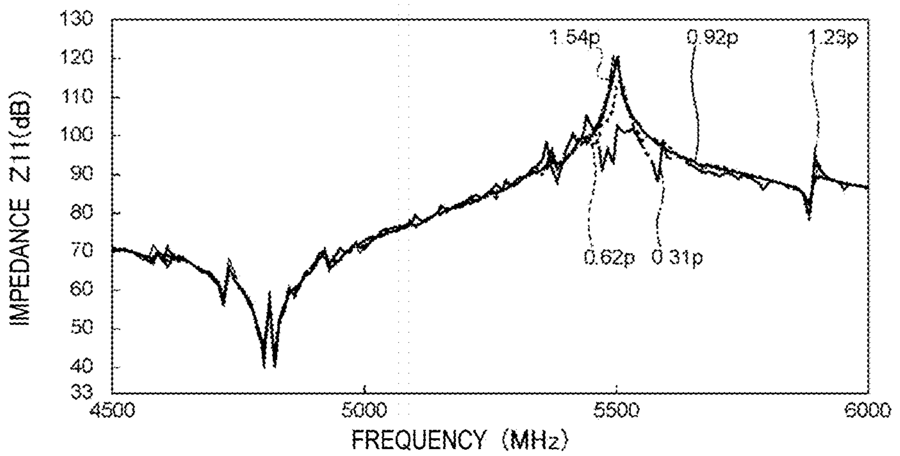
FIG. 10 illustrates impedance-frequency characteristics when the length of a first gap and a second gap in a first direction is in the range of about 0.31p to about 1.54p.

Center-to-center distance p between the first electrode finger and the second electrode finger: about 3.25 μm Length of the first dummy electrode finger and the second dummy electrode finger in the first direction: about 3 μm Length of the first gap and the second gap in the first direction: about 0.31p, about 0.62p, about 0.92p, about 1.23p, about 1.54p FIG. 10 illustrates impedance-frequency characteristics when the length of the first gap and the second gap in the first direction is in the range of about 0.31p to about 1.54p.

As illustrated in FIG. 10, comparison with the case in which the length of the first gap and the second gap in the first direction is about 0.92p or longer indicates that the impedance characteristic is degraded in the case of about 0.62p. In the case of about 0.31p, the impedance characteristic is further degraded. As described above, when the length is about 0.92p or shorter, the resonance characteristic deteriorates. In the present preferred embodiment illustrated in FIG. 9, because the length of the first gap G1 and the second gap G2 in the first direction y is about 0.92p or longer, the resonance characteristic does not deteriorate much.

Figure 11:
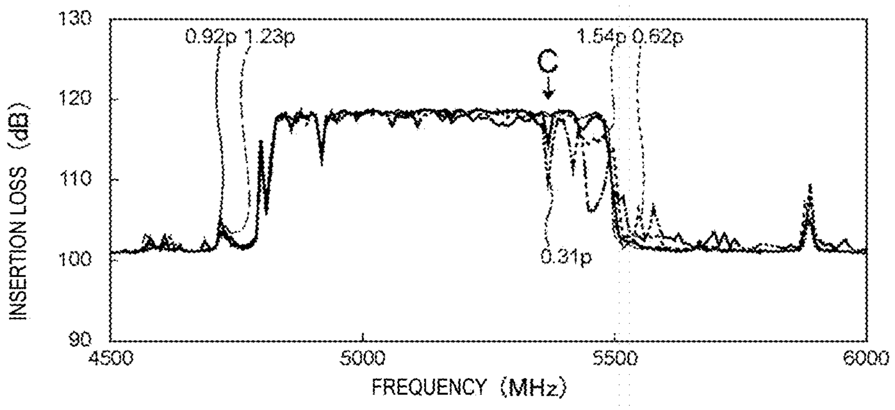
FIG. 11 illustrates attenuation-frequency characteristics when the length of the first gap and the second gap in the first direction is in the range of about 0.31p to about 1.54p.

FIG. 11 illustrates attenuation-frequency characteristics when the length of the first gap and the second gap in the first direction is in the range of about 0.31p to about 1.54p.

As illustrated in FIG. 11, when the length of the first gap and the second gap in the first direction is about 0.31p, a large magnitude of ripple occurs at the frequency indicated by an arrow C. By contrast, when the length is about 0.92p or longer, ripple is suppressed. In the present preferred embodiment illustrated in FIG. 9, because the length of the first gap G1 and the second gap G2 in the first direction y is about 0.92p or longer, ripple can be suppressed.

In a preferred embodiment of the present invention, it is desirable that the following expression be satisfied: MR 1.75(d/p)+0.075, where MR is the metallization ratio of adjacent first and second electrode fingers 8 and 9 to the excitation domain B. In this case, spurious response can be effectively decreased. This will be described with reference to FIGS. 12 and 13.

Figure 12:
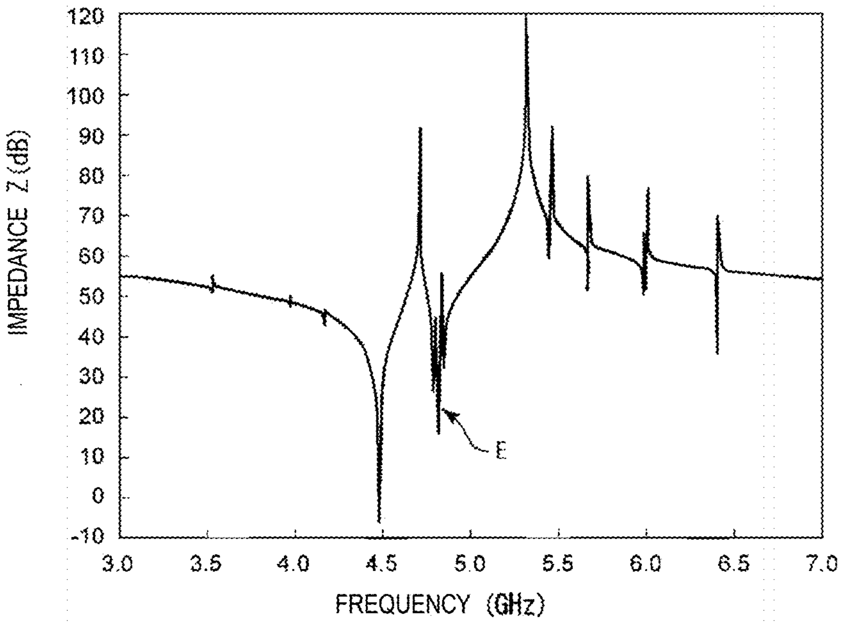
FIG. 12 is a reference diagram illustrating an example of the resonance characteristic of an acoustic wave device according to a preferred embodiment of the present invention.

FIG. 12 is a reference diagram illustrating an example of the resonance characteristic of an acoustic wave device according to a preferred embodiment of the present invention. A spurious response indicated by an arrow E appears between the resonant frequency and the anti-resonant frequency. In this case, d/p=about 0.08, Euler angles of $LiNbO_3$ are (0°, 0°, 90°); the metallization ratio MR=about 0.35.

The following describes the metallization ratio MR with reference to FIG. 1B. It is assumed that the electrode structure in FIG. 1B includes a single first and second electrode 8 and 9 pair. In this case, the region defined by a dot-dash line is the excitation domain B. More specifically, this excitation domain B includes the following three regions 1) to 3): 1) of the first electrode finger 8, a region coinciding with the second electrode finger 9 in the second direction y; 2) of the second electrode finger 9, a region coinciding with the first electrode finger 8 in the second direction y; 3) of the region between the first electrode finger 8 and the second electrode finger 9, a region coinciding with the first electrode finger 8 and the second electrode finger 9 in the second direction y. The areas of the first and second electrode fingers 8 and 9 in the excitation domain B to the area of the excitation domain B yields the metallization ratio MR. In other words, the metallization ratio MR is the ratio of the area of the metallized portion to the area of the excitation domain B.

When a plurality of first and second electrode finger 8 and 9 pairs are included, MR can be obtained by calculating the ratio of metallized portions included in all the excitation domains B to the total area of the excitation domains B.

Figure 13:
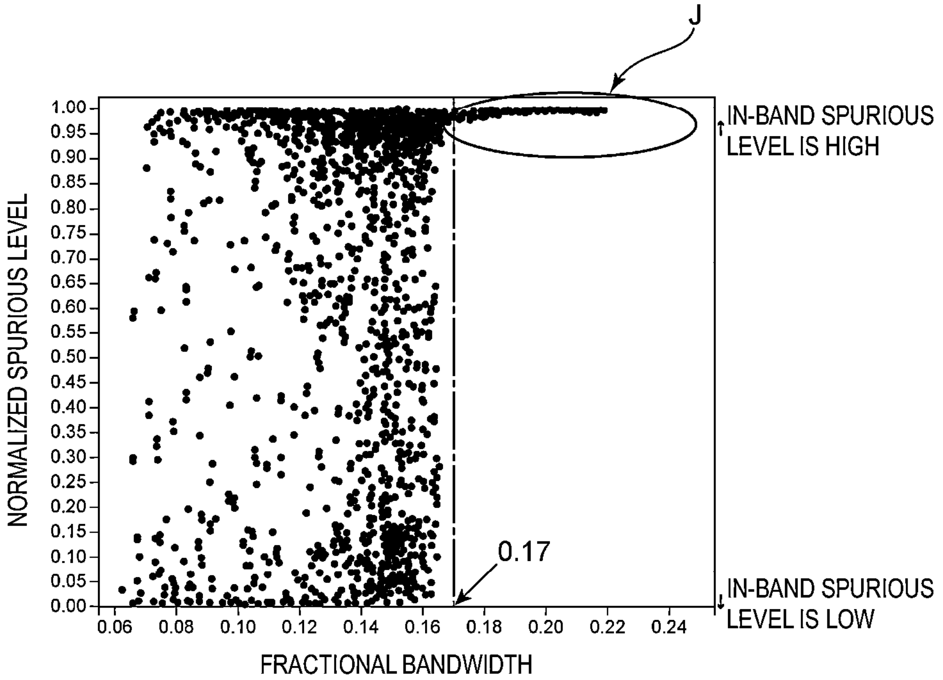
FIG. 13 illustrates plots of normalized spurious level versus fractional bandwidth.

FIG. 13 illustrates plots of normalized spurious level versus fractional bandwidth when many acoustic wave resonators were configured according to various preferred embodiments of the present invention. The spurious level is obtained by normalizing phase rotation of spurious signal with 180 degrees. The fractional bandwidth was controlled by changing the thickness of piezoelectric film and the dimensions of electrode finger. FIG. 13 illustrates results obtained in the case using a piezoelectric film made of Z-cut $LiNbO_3$, but the same tendency can be achieved with piezoelectric films of other cut-angles.

In the region enclosed by an oval J in FIG. 13, spurious is as high as about 1.0. As seen from FIG. 13, when the fractional bandwidth exceeds about 0.17, that is, about 17%, regardless of changing parameters affecting the fractional bandwidth, spurious signals at levels of 1 or higher are caused in the pass band. Hence, it is preferable that the fractional bandwidth is about 17% of higher. In this case, spurious signals can be decreased by controlling the thickness of the piezoelectric film 2 and the dimensions of the first and second electrode fingers 8 and 9.

Figure 14:
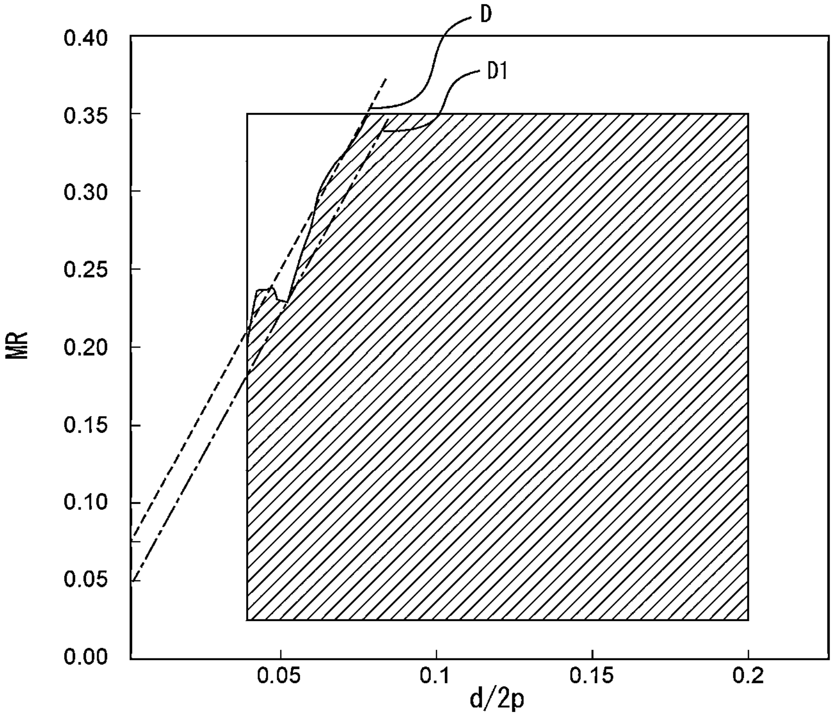
FIG. 14 illustrates the relationship between d/2p and metallization ratio MR with respect to fractional bandwidth.

FIG. 14 illustrates the relationship between d/2p and the metallization ratio MR with respect to fractional bandwidth. Various acoustic wave devices were configured according to the present invention with different d/2p and MR, and the fractional bandwidth was measured. The portion shaded with hatching on the right side with respect to a dashed line D in FIG. 14 indicates a region of a fractional bandwidth of 17% or lower. The boundary between this hatched region and the non-hatched region is given by MR=3.5(d/2p)+0.075, that is, MR=1.75(d/p)+0.075. As a result, it is preferable that MR≤1.75(d/p)+0.075. In this case, the fractional bandwidth can be easily controlled to be about 17% or lower. The region on the right side with respect to a dot-dash line D1 given by MR=3.5(d/2p)+0.05 in FIG. 14 is more preferable. In other words, it is preferable that MR≤1.75(d/p)+0.05. In this case, the fractional bandwidth can be certainly controlled to be about 17% or lower.

Figure 15:
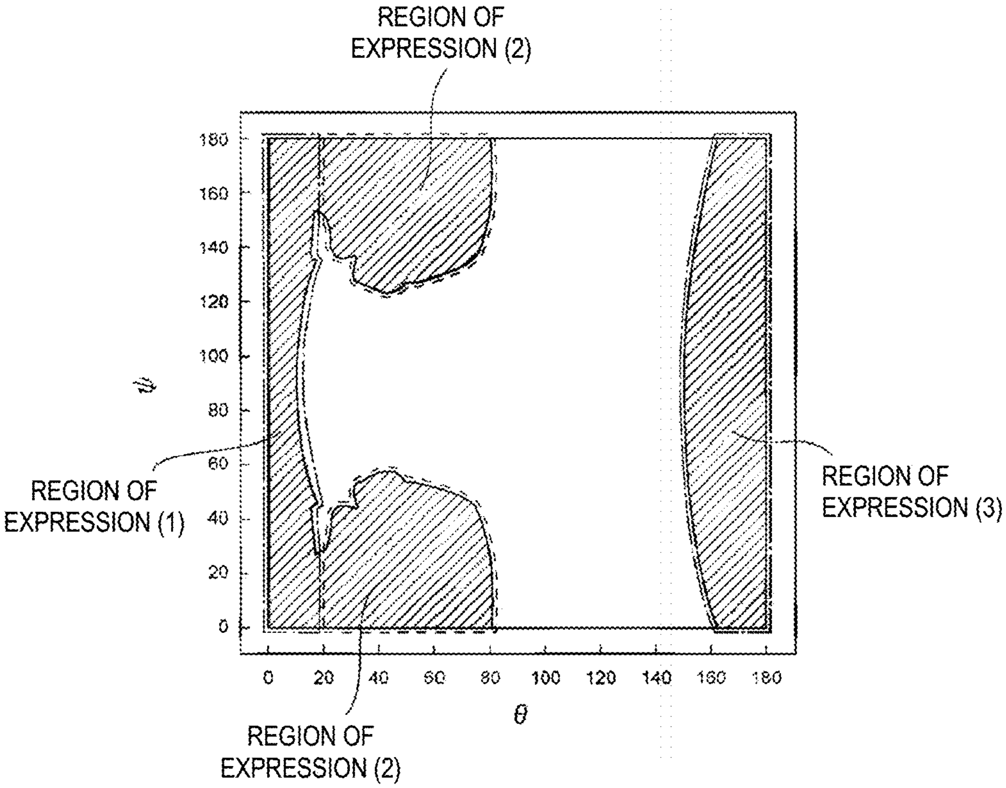
FIG. 15 illustrates a map of fractional bandwidth with respect to Euler angles (0°, θ, ψ) of $LiNbO_3$ when d/p is set as close to 0 as possible.

FIG. 15 illustrates a map of fractional bandwidth with respect to Euler angles (0°, θ, ψ) of $LiNbO_3$ when d/p is set as close to 0 as possible. The portions shaded with hatching in FIG. 15 are regions in which at least 5% or higher fractional bandwidth can be achieved. The regions can be approximated by the following expressions (1), (2), and (3).

(0°±10°,0° to 20°, any ψ) Expression (1)

(0°±10°,20° to 80°, 0° to 60° (1−(θ−50)2/900)1/2) or (0°±10°,20° to 80°,[180°−60° (1−(θ−50)2/900) 1/2] to 180°) Expression (2)

(0°±10°,[180°−30° (1−(ψ−90)2/8100)1/2] to 180°, any ψ) Expression (3)

The Euler angle region of Expression (1), (2), or (3) is preferable because the fractional bandwidth can be sufficiently widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric film made of lithium niobate or lithium tantalate;

a first busbar electrode and a second busbar electrode located on the piezoelectric film and opposite to each other; and a first electrode finger and a second electrode finger on the piezoelectric film, the first electrode finger including one end coupled to the first busbar electrode, the second electrode finger including one end coupled to the second busbar electrode;

the acoustic wave device being configured to use a bulk wave in a first thickness-shear mode; wherein the first electrode finger and the second electrode finger extend in a first direction, the first direction is perpendicular to a second direction, the first electrode finger and the second electrode finger face each other in the second direction;

a first gap is provided between the first busbar electrode and the second electrode finger, and a second gap is provided between the second busbar electrode and the first electrode finger; and a length of the first gap in the first direction and a length of the second gap in the first direction are both about 0.92p or longer, where p is a center-to-center distance between the first electrode finger and the second electrode finger, and the first electrode finger and the second electrode finger are adjacent to each other.

2. The acoustic wave device according to claim 1, wherein the length of the first gap in the first direction and the length of the second gap in the first direction are both about 9.2p or shorter.

3. The acoustic wave device according to claim 1, wherein the length of the first gap in the first direction and the length of the second gap in the first direction are both about 3p or shorter.

4. The acoustic wave device according to claim 1, wherein d/p is about 0.24 or smaller, where d is a thickness of the piezoelectric film, and p is the center-to-center distance between the first electrode finger and the second electrode finger that are adjacent to each other.

5. The acoustic wave device according to claim 1, wherein when viewed in the second direction, a region in which the first electrode finger and the second electrode finger that are adjacent to each other overlap is an excitation domain, and MR≤1.75 (d/p)+0.075, where MR is a metallization ratio of the first electrode finger and the second electrode finger to the excitation domain.

6. The acoustic wave device according to claim 1, wherein a thickness of the piezoelectric film is about 40 nm to about 1000 nm.

7. The acoustic wave device according to claim 1, wherein the acoustic wave device does not contain a reflector.

8. The acoustic wave device according to claim 1, wherein one end of the second electrode finger faces the first busbar electrode across the first gap.

9. The acoustic wave device according to claim 1, wherein one end of the first electrode finger faces the second busbar electrode across the second gap.

10. The acoustic wave device according to claim 1, further comprising a plurality of first dummy electrode fingers and a plurality of second dummy electrode fingers.

11. An acoustic wave device comprising:

a piezoelectric film made of lithium niobate or lithium tantalate;

a first busbar electrode and a second busbar electrode located on the piezoelectric film and opposite to each other; and a first electrode finger and a second electrode finger on the piezoelectric film, the first electrode finger including one end coupled to the first busbar electrode, the second electrode finger including one end coupled to the second busbar electrode; wherein d/p is about 0.5 or smaller, where d is a thickness of the piezoelectric film, p is a center-to-center distance between the first electrode finger and the second electrode finger, and the first electrode finger and the second electrode finger are adjacent to each other;

the first electrode finger and the second electrode finger extend in a first direction, the first direction is perpendicular to a second direction, the first electrode finger and the second electrode finger face each other in the second direction;

a first gap is provided between the first busbar electrode and the second electrode finger, and a second gap is provided between the second busbar electrode and the first electrode finger; and a length of the first gap in the first direction and a length of the second gap in the first direction are both about 0.92p or longer.

12. The acoustic wave device according to claim 11, wherein the length of the first gap in the first direction and the length of the second gap in the first direction are both about 9.2p or shorter.

13. The acoustic wave device according to claim 11, wherein the length of the first gap in the first direction and the length of the second gap in the first direction are both about 3p or shorter.

14. The acoustic wave device according to claim 11, wherein d/p is about 0.24 or smaller, where d is a thickness of the piezoelectric film, and p is the center-to-center distance between the first electrode finger and the second electrode finger that are adjacent to each other.

15. The acoustic wave device according to claim 11, wherein when viewed in the second direction, a region in which the first electrode finger and the second electrode finger that are adjacent to each other overlap is an excitation domain, and MR≤1.75 (d/p)+0.075, where MR is a metallization ratio of the first electrode finger and the second electrode finger to the excitation domain.

16. The acoustic wave device according to claim 11, wherein a thickness of the piezoelectric film is about 40 nm to about 1000 nm.

17. The acoustic wave device according to claim 11, wherein the acoustic wave device does not contain a reflector.

18. The acoustic wave device according to claim 11, wherein one end of the second electrode finger faces the first busbar electrode across the first gap.

19. The acoustic wave device according to claim 11, wherein one end of the first electrode finger faces the second busbar electrode across the second gap.

20. The acoustic wave device according to claim 11, further comprising a plurality of first dummy electrode fingers and a plurality of second dummy electrode fingers.

* * * * *